United States Patent
Jang et al.

(10) Patent No.: US 7,132,331 B2
(45) Date of Patent: Nov. 7, 2006

(54) NON-VOLATILE SEMICONDUCTOR MEMORY DEVICES HAVING SELF-ALIGNED GATE CONDUCTIVE LAYERS AND METHODS OF FABRICATING SUCH DEVICES

(75) Inventors: Young-Goan Jang, Gyeonggi-do (KR); Chang-Hyun Lee, Gyeonggi-do (KR); Jae-Hoon Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/990,903

(22) Filed: Nov. 17, 2004

(65) Prior Publication Data
US 2005/0136601 A1 Jun. 23, 2005

(30) Foreign Application Priority Data
Dec. 19, 2003 (KR) .............. 10-2003-0094000

(51) Int. Cl.
*H01L 21/336* (2006.01)
(52) U.S. Cl. ............. 438/259; 438/267; 257/315
(58) Field of Classification Search .......... 438/259, 438/267; 257/315
See application file for complete search history.

(56) References Cited

U.S. PATENT DOCUMENTS

| | | | |
|---|---|---|---|
| 6,187,651 B1* | 2/2001 | Oh | 438/435 |
| 6,620,681 B1* | 9/2003 | Kim et al. | 438/257 |
| 6,743,675 B1* | 6/2004 | Ding | 438/257 |
| 2003/0119260 A1 | 6/2003 | Kim et al. | 438/257 |
| 2003/0203594 A1* | 10/2003 | Shimizu et al. | 438/424 |
| 2004/0201058 A1* | 10/2004 | Sonoda et al. | 257/314 |

FOREIGN PATENT DOCUMENTS

| | | |
|---|---|---|
| JP | 09-321132 | 12/1997 |
| JP | 11-176962 | 7/1999 |
| JP | 2000-200841 | 7/2000 |
| KR | 0100589456 | 6/2001 |
| KR | 10-2003-0028596 | 4/2003 |
| KR | 1020030056388 | 4/2003 |
| KR | 10-2003-0053314 | 6/2003 |

OTHER PUBLICATIONS

Office Action for Korean patent application No. 2003-94000 completed on Oct. 31, 2005.

\* cited by examiner

*Primary Examiner*—Trung Dang
(74) *Attorney, Agent, or Firm*—Myers Bigel Sibley & Sajovec

(57) ABSTRACT

A semiconductor device having a self-aligned gate conductive layer and a method of fabricating the same are disclosed. In embodiments of the present invention, a plurality of field isolation patterns are formed on a semiconductor substrate to define a plurality of active regions in the semiconductor substrate. The density of the field isolation patterns is then increased by, for example, a thermal annealing process. A plurality of gate insulation patterns are then formed on respective of the active regions. A plurality of first conductive patterns are then formed on respective of the gate insulation patterns.

42 Claims, 10 Drawing Sheets

NON-VOLATILE SEMICONDUCTOR MEMORY DEVICES HAVING SELF-ALIGNED GATE CONDUCTIVE LAYERS AND METHODS OF FABRICATING SUCH DEVICES

CLAIM OF PRIORITY

This application claims priority under 35 U.S.C. § 119 from Korean Patent Application No. 2003-94000, filed on Dec. 19, 2003, the disclosure of which is incorporated herein by reference as if set forth in its entirety.

FIELD OF THE INVENTION

The present invention relates to non-volatile semiconductor memory devices and methods of forming the same. More particularly, the present invention relates to non-volatile semiconductor memory devices having self-aligned layers and methods of fabricating such devices.

BACKGROUND

Conventionally, metal oxide semiconductor field effect transistors (MOSFET) are fabricated by forming field isolation layers in a semiconductor substrate to define a plurality of active regions. Shallow trench isolation (STI) techniques are often used to form the field isolation layers. When an STI technique is used, trench mask patterns are formed on the semiconductor substrate. The trench mask patterns are then used as an etch mask in an anisotropic etch process to form trenches at the semiconductor substrate that are then filled to form the field isolation layers.

In the case of forming a non-volatile memory cell, control gate electrodes (or gate electrodes) are formed to cross over the respective active regions with floating gate electrodes disposed thereunder. The process used to form the floating gate electrodes generally includes two patterning processes. The first patterning process employs a mask pattern that runs in parallel to the active region. The second patterning process uses a mask pattern that runs in a vertical direction to the active region which may be used to form the gate electrodes.

However, the patterning process that uses a mask pattern that runs in a parallel direction to the active region requires an additional mask pattern. Thus, in order to form the floating gate electrodes, a photolithography process should additionally be performed. In this photolithography process, process parameters such as the width that the floating gate electrode overlap each edge of the field isolation layer and the "overlap symmetry" (i.e., the symmetry with which the floating gate electrode overlaps the field isolation layer) are strictly controlled. However, as semiconductor devices become more highly integrated, it can become difficult to strictly control these process parameters, and the cost of the photolithography process may be relatively high.

SUMMARY OF THE INVENTION

Embodiments of the present invention provide semiconductor devices having a self-aligned gate conductive layer and methods of fabricating such devices. In certain embodiments of the present invention, a plurality of field isolation patterns are formed on a semiconductor substrate to define a plurality of active regions in the semiconductor substrate. The density of the field isolation patterns is then increased. A plurality of gate insulation patterns are formed on respective of the active regions. A plurality of first conductive patterns are then formed on respective of the gate insulation patterns.

In specific embodiments of the present invention, the increase in the density of the field isolation patterns may be achieved using a thermal annealing process. For example, the field isolation patterns may be thermally annealed at one or more temperatures in the range from about 500 Celsius to about 900 Celsius for a time ranging from about 5 minutes to about 1 hour. The time, temperature and/or length of the thermal annealing process may be selected to ensure that the field isolation patterns are not excessively recessed during a subsequent removal of an oxide layer.

In some embodiments of the present invention, first and second conductive spacers may be provided on sidewalls of at least some of the first conductive patterns. These first and second conductive spacers may be formed by etching the field isolation patterns after forming the first conductive patterns to form a plurality of gap regions, where the gap regions are between adjacent of the first conductive patterns. Then, a conductive layer may be formed on at least the first conductive patterns and sidewalls of the gap regions so as to at least partially fill a seam that may be present in a top surface of one or more of the first conductive patterns. The conductive layer may then be anisotropically etched to expose the top surface of the field isolation patterns. An insulative layer may optionally be formed on the field isolation patterns and the sidewalls and top surfaces of the first conductive patterns, and a second conductive layer may then be formed on the insulative layer.

The field isolation patterns may be formed by forming trench mask patterns on the substrate which are used to form trenches that define the active regions. Then, the field isolation patterns may be formed in the trenches and spaces between the trench mask patterns. The plurality of first conductive patterns may be formed by forming a first conductive layer on the gate insulation patterns and on the field isolation patterns and then planarizing the first conductive layer at least to the depth of the top surface of the field isolation patterns to form the plurality of first conductive patterns. The increased density field isolation patterns may also be partially etched in certain embodiments of the present invention so that the field isolation patterns each have an upper portion that has a width that is less than a width of a lower portion of each field isolation pattern.

In further embodiments of the present invention, methods of fabricating a semiconductor device are provided in which trench mask patterns are formed on a semiconductor substrate. Trenches are formed that define active regions at the semiconductor substrate between the trench mask patterns. Field isolation patterns may be formed in the trenches and spaces between the trench mask patterns. These field isolation patterns may then be thermally annealed to increase their density, and the trench mask patterns may be removed. In specific embodiments, the thermal annealing may be at one or more temperatures in the range from about 500 Celsius to about 900 Celsius for a time ranging from about 5 minutes to about 1 hour. A plurality of gate insulation patterns are formed on respective of the plurality of active regions, and a plurality of first conductive patterns are formed on respective of the plurality of gate insulation patterns.

The trench mask patterns may be formed by forming a trench mask layer that includes at least a pad oxide layer and an silicon nitride layer on the substrate and then pattering the trench mask layer to form a pad oxide pattern and a silicon nitride pattern on each active region. The field isolation patterns may be formed by forming a field isolation layer in the trenches and then planarization-etching the field isolation layer to expose the trench mask patterns. A thermal oxide layer may also be formed on inner walls of the trenches before the field isolation layer is formed.

In specific embodiments of the present invention, the trench mask patterns may be removed by removing the silicon nitride patterns using a selective etch recipe that does not significantly etch the pad oxide patterns or the field isolation patterns and then removing the pad oxide patterns and etching a portion of the exposed field isolation patterns to a predetermined extent. In these embodiments, the thermal annealing may be performed before the pad oxide patterns are removed.

In still other specific embodiments, after the plurality of first conductive patterns are formed, the field isolation patterns may be etched to form a plurality of gap regions between adjacent of the first conductive patterns. A gate interlayer insulator may be formed on the field isolation patterns and the sidewalls and top surfaces of the first conductive patterns and then, a second conductive layer may be formed on the gate interlayer insulator. The gate interlayer insulator may be formed of sequentially stacked silicon oxide, silicon nitride and silicon oxide, and the second conductive layer may be formed of at least one material selected from the group consisting of multi-crystalline silicon, tungsten, cobalt, tungsten silicide, cobalt silicide and/or copper. In addition, before forming the gate interlayer insulator, conductive spacers may be formed on sidewalls of the first conductive patterns. These conductive spacers may be formed, for example, by forming a conductive layer on at least the first conductive patterns and sidewalls of the gap regions and then anisotropically etching the conductive layer to expose a top surface of the field isolation patterns.

In certain embodiments of the present invention, the thermal annealing may be performed after the trench mask patterns are removed. The time, temperature and/or length of the thermal annealing process may be selected to ensure that the field isolation patterns are not excessively recessed during a subsequent removal of the pad oxide layers. Additionally, the upper portion of each field isolation pattern may include a recess on each side, and the first conductive layer may be formed on a lower portion of each field isolation pattern to fill the recess on each side of the upper portion of each field isolation pattern. The thermally annealed field isolation patterns may also be partially etched so that the field isolation patterns each have an upper portion that has a width that is less than a width of a lower portion of each field isolation pattern.

In embodiments of the present invention, the first and second conductive spacers may be formed, for example, of at least one material selected from the group consisting of multi-crystalline silicon, tungsten, cobalt, tungsten silicide, cobalt silicide and/or copper. The field isolation layer may be formed, for example, of at least one material selected from the group consisting of HTO, PETEOS, MTO, HDP and/or SOG layers. The gate insulation patterns may be formed, for example, of at least one material selected from the group consisting of silicon oxide, tungsten nitride, conductive patterns may be formed, for example, of at least one material selected from the group consisting of multi-crystalline silicon, tungsten, cobalt, tungsten silicide, cobalt silicide and/or copper. Additionally, the first conductive patterns and the conductive layer may be formed of substantially the same material.

In still other embodiments of the present invention, methods of fabricating a non-volatile semiconductor memory device are provided in which a plurality of field isolation patterns are formed on a semiconductor substrate to define a plurality of active regions therebetween. A plurality of gate insulating patterns are formed on respective of the active regions between the respective plurality of field isolation patterns so that upper surfaces of adjacent ones of the plurality of field isolation patterns above facing side walls thereof are exposed. A plurality of floating gate electrodes are formed on respective of the gate insulation patterns and on the exposed upper surfaces of the plurality of field isolation patterns, and a gate interlayer insulator layer is formed on the plurality of floating gate electrodes. A control gate electrode is then formed on the gate interlayer insulator layer.

Pursuant to still further embodiments of the present invention, semiconductor devices are provided in which a plurality of field isolation patterns define a plurality of active regions at a semiconductor substrate. A plurality of gate insulation patterns are on respective of the plurality of active regions, and a plurality of first conductive patterns are on respective of the plurality of gate insulation patterns. A pair of conductive spacers are on the first and second sidewalls of each of the first conductive patterns, and a sequentially stacked gate interlayer insulator and second conductive layer are on the pairs of conductive spacers and the first conductive patterns. The first conductive patterns may be wider than the active region disposed thereunder. The conductive spacers may be formed of at least one material selected from the group consisting of multi-crystalline silicon, tungsten, cobalt, tungsten silicide, cobalt silicide and/or copper, and the first conductive patterns and the conductive spacers may be formed of substantially the same material.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF THE INVENTION

Figure 1:
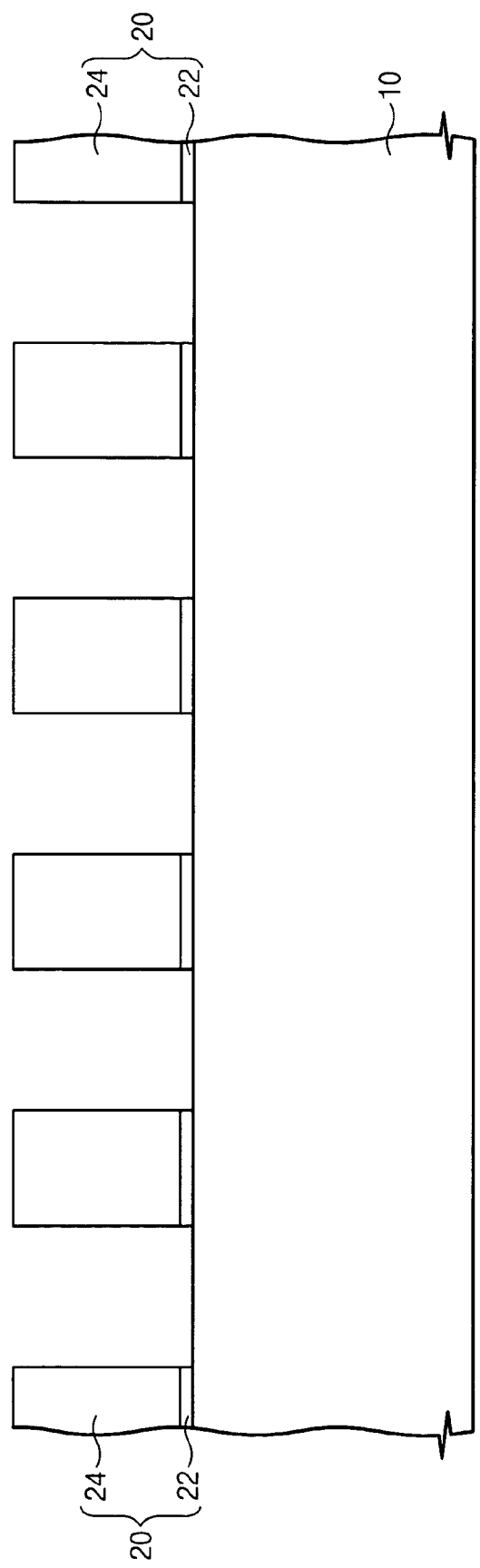
FIGS. 1–6 are cross-sectional views illustrating methods of forming a semiconductor device according to embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As shown in FIG. 1, trench mask patterns 20 are formed that expose predetermined regions of a semiconductor substrate 10. The trench mask patterns 20 may include a pad oxide pattern 22 and a silicon nitride pattern 24 that are sequentially stacked.

In order to form the trench mask patterns 20, a trench mask layer may be formed and patterned. The trench mask layer may comprise a multilayer insulation layer that includes a pad oxide layer and a silicon nitride layer. The trench mask layer may further include a medium temperature oxide (MTO) and/or an anti-refractive layer. The MTO and the anti-refractive layer may be sequentially stacked on the silicon nitride layer.

In certain embodiments of the present invention, the silicon nitride pattern 24 may be used as both an etch mask in a subsequent trench etch process and as a mold layer that defines the shape of a field isolation layer. The silicon nitride pattern 24 may have, for example, a thickness of about 800 to 2000 Angstroms. The pad oxide pattern 22 may absorb stresses between the silicon nitride pattern 24 and the silicon substrate 10 which may occur due, for example, to differences between the thermal expansion coefficients thereof.

Figure 2:
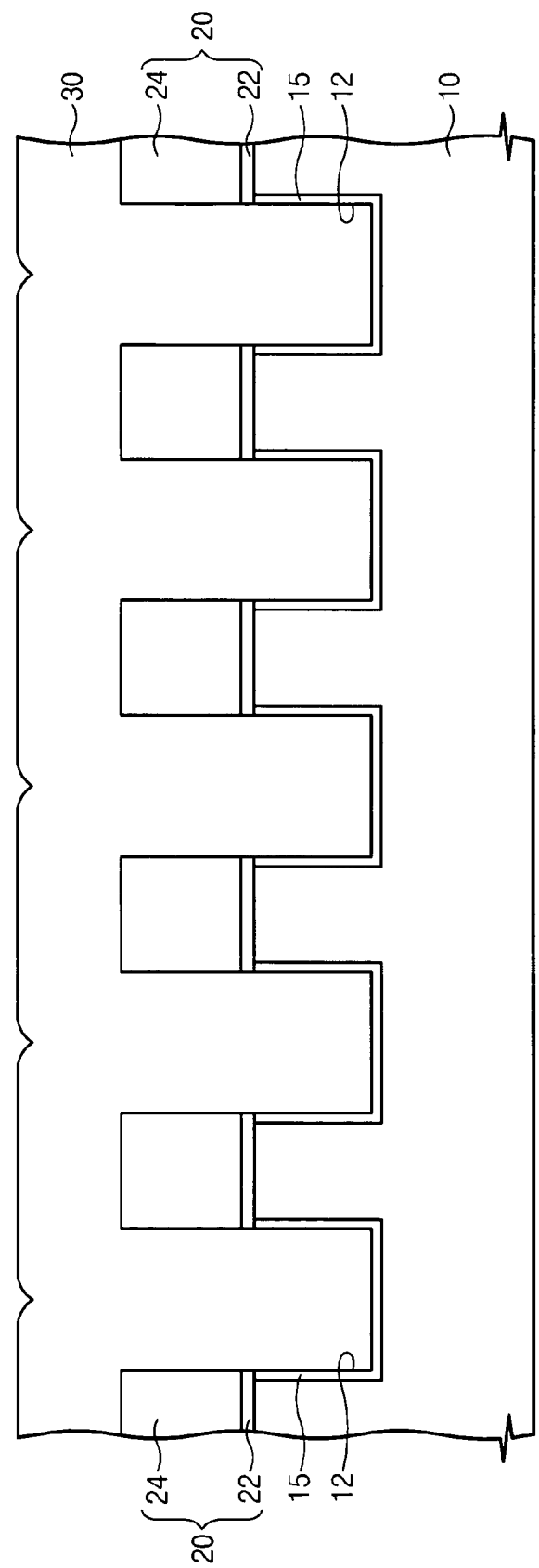

As shown in FIG. 2, the semiconductor substrate 10 may be etched using the trench mask patterns 20 as etch masks to form trenches 12 at the semiconductor substrate 10 among the trench mask patterns 20. The trenches 12 may be formed, for example, using an anisotropic etching process using plasma. However, such an anisotropic etching process can cause etch damage at the inner walls of the trenches 12. Accordingly, a thermal oxidation process may be performed after the trenches 12 are formed to cure any such etch damage. This thermal oxidation process may form a thermal oxide layer 15 on the inner walls of the trenches 12.

A field isolation layer 30 may then be formed on the substrate. As shown in FIG. 2, the field isolation layer 30 may fill the trenches 12 and may be formed to cover top surfaces of the trench mask patterns 20, as well as gap regions surrounded by the trench mask patterns 20. In certain embodiments of the present invention, the field isolation layer 30 may be formed of one or more of the following materials: a high temperature oxide (HTO), a plasma enhanced tetraethyl orthosilicate (PETEOS) layer, an MTO, a high density plasma (HDP) oxide layer and/or a spin-on glass (SOG) layer. By way of example, the field isolation layer 30 may comprise an HTO layer and a PETEOS layer that are sequentially stacked.

Figure 3:
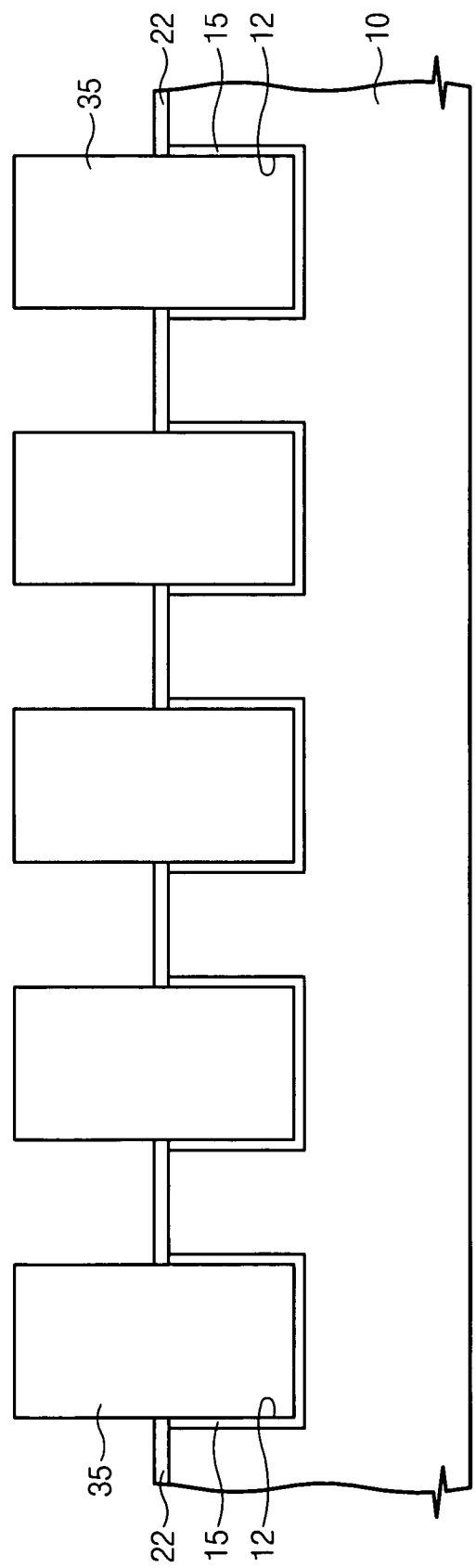

Referring to FIG. 3, the field isolation layer 30 may then be partially removed using, for example, a planarization-etching process to expose the silicon nitride patterns 24. The planarization-etching process may comprise, for example, a chemical mechanical polishing (CMP) process. As a result of this process, field isolation patterns 35 are formed in the trenches 12 and in the gap regions among the trench mask patterns 20. The height and width of the field isolation patterns 35 may be determined by the height of and the distance between the trench mask patterns 20.

Next, the exposed silicon nitride patterns 24 may selectively removed to expose the pad oxide patterns 22. In certain embodiments of the present invention, the silicon nitride patterns 24 may be removed using an etch recipe that has an etch selectivity as between the silicon nitride patterns 24 and both the pad oxide patterns 22 and the field isolation patterns 35.

After removing the silicon nitride patterns 24, a thermal annealing process may be performed. This thermal annealing process may be used to increase the density of the field isolation patterns 35 so that they may not be excessively recessed in a subsequent process that may be used to remove the pad oxide patterns 22. In certain embodiments of the present invention, the thermal annealing process can be performed at a pressure ranging from about 0.3 to 1.5 atmospheres and at a temperature ranging from about 500 to 900 Celsius for about 5 minutes to about 1 hour. For example, in one specific embodiment, the thermal annealing process may be performed at atmospheric pressure and at a temperature of 800 Celsius for 30 minutes. It will be appreciated that a wide variety of other annealing processes may be used, and that the temperature and/or pressure may or may not be held constant throughout the annealing process. It will also be appreciated that the thermal annealing process may be performed at a different point in the process, such as before the silicon nitride patterns 24 are removed.

An ion-implantation process may also be performed to implant impurities in the semiconductor substrate 10 below the pad oxide patterns 22. The thermal annealing process may be used to activate the impurities implanted in the ion-implantation process.

Figure 4:
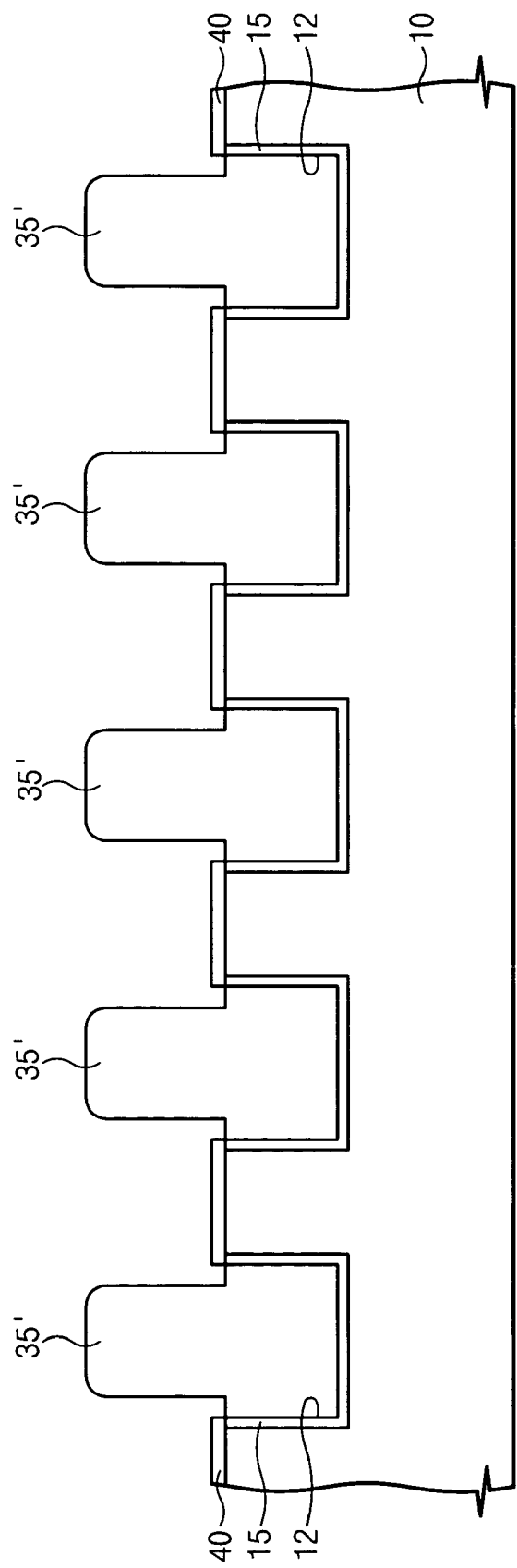

As shown in FIG. 4, the pad oxide patterns 22 may next be removed to expose portions of the semiconductor substrate 10. The pad oxide patterns 22 may be removed, for example, using an etching process that has an etch selectivity between the pad oxide patterns 22 and the semiconductor substrate 10. In certain embodiments of the present invention, the pad oxide patterns 22 are removed using an isotropic etch method in order to reduce and/or minimize etch damage.

In certain embodiments of the present invention, both the field isolation patterns 35 and the pad oxide patterns 22 may be formed of silicon oxide. In such embodiments, the field isolation patterns 35 are etched together with the pad oxide patterns 22 such that the field isolation patterns 35 are converted into recessed field isolation patterns 35' during the etching process that is used to remove the pad oxide pattern 22. As a result, the sides of the upper portion of each field isolation pattern 35' (i.e., the portion that is furthest from the semiconductor substrate 10) may be recessed to have a narrower width than the bottom portion of the field isolation pattern 35' that is in the trench 12 (see FIG. 4). In other words, a protruding portion of the field isolation pattern 35' is narrower than a lower portion in the trench 12. The width of the recess of the upper portion of a field isolation pattern 35' on each side of the active region may be essentially identical since the recessed region may be formed using an isotropic etch process. Additionally, the extent to which the upper portion of the field isolation patterns 35' are recessed may be controlled by the extent to which the field isolation layer 35 is made denser by the above-described thermal annealing process. Thus, the process may be controlled so the field isolation patterns 35' are not excessively recessed during the process that is used to remove the pad oxide pattern 22.

As is also shown in FIG. 4, gate insulating patterns 40 may be formed on the top surface of the semiconductor substrate 10. The gate insulating patterns layer 40 may be formed, for example, of at least one material selected from the group consisting of silicon oxide, tungsten nitride, titanium nitride, tantalum nitride, silicon nitride and silicon oxynitride. By way of example, the gate insulating patterns 40 may be formed of silicon oxide using a thermal oxidation process.

Figure 5:
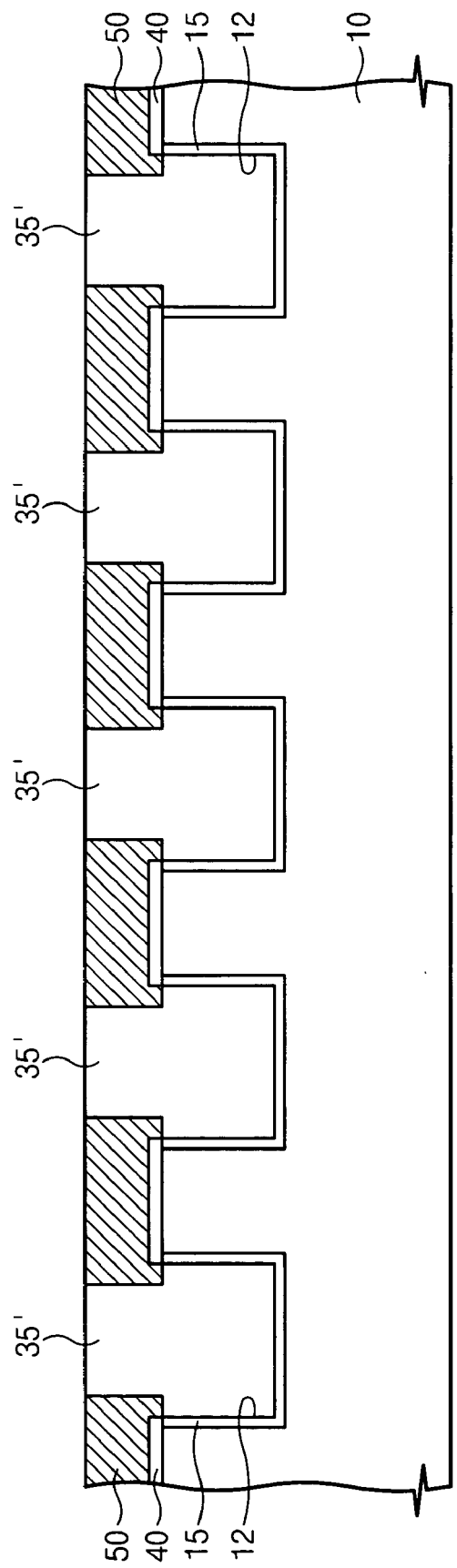

Referring to FIG. 5, a first conductive layer may be formed on the semiconductor substrate 10, the gate insulation patterns 40 and the field isolation patterns 35'. The first conductive layer may be formed, for example, of at least one material selected from the group consisting of multi-crystalline silicon, tungsten, cobalt, tungsten silicide, cobalt silicide and/or copper. By way of example, the first conductive layer may comprise a multi-crystalline silicon layer.

Next, the first conductive layer may be planarized-etched until top surfaces of the field isolation patterns 35' are exposed. This may be accomplished, for example, using a CMP process. As a result of this process, first conductive patterns 50 may be formed on top surfaces of the gate insulation patterns 40 between the field isolation patterns 35'. The field isolation patterns 35' may be used as an etch-stop layer for determining an end-point in the CMP process. Thus, as described above, the field isolation patterns 35', which are not excessively recessed in the horizontal direction by the thermal annealing process, can function as an etch-stop layer in the vertical etch process that is used to form the first conductive patterns 50. As a result, the heights of the first conductive patterns 50 can be controlled to be relatively uniform. As shown in FIG. 5, the first conductive patterns 50 are disposed between the recessed field isolation patterns 35'. As such, a first conductive pattern 50 and the adjacent field isolation patterns 35' may be overlapped at both sides thereof as the width of the first conductive pattern 50 may exceed the width of the active region. The extent to which each first conductive pattern 50 overlaps the field isolation patterns 35' on each side of the active region may also be relatively uniform.

Figure 6:
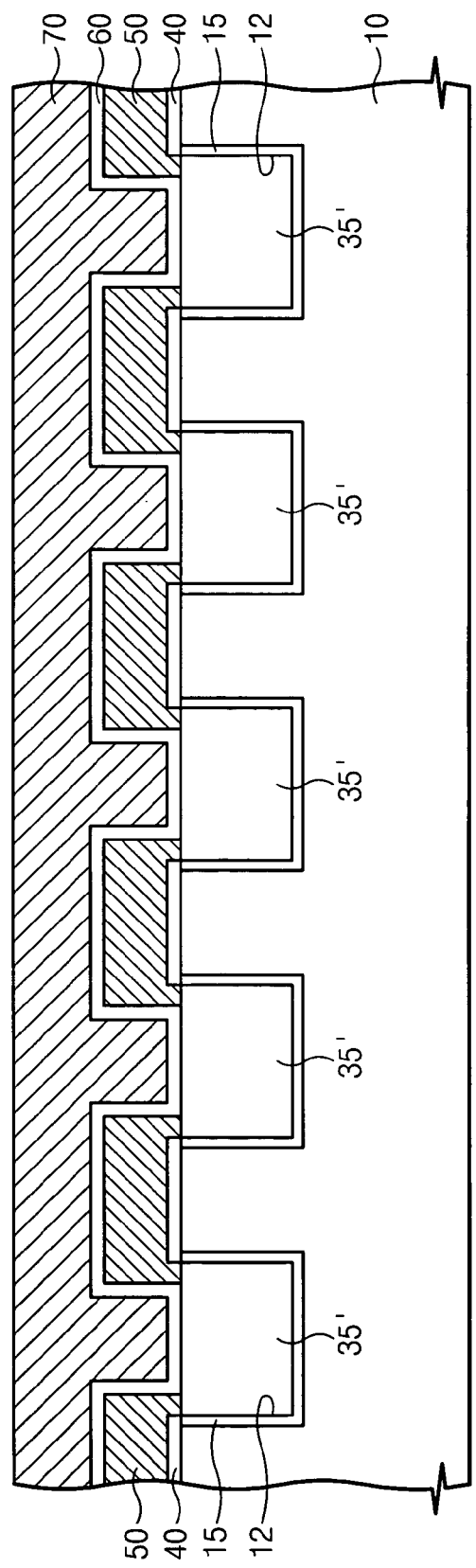

As shown in FIG. 6, next, a top portion of the field isolation patterns 35' may be etched to form a plurality of gap regions between the first conductive patterns 50. This etch process may use an etch recipe that has an etch selectivity as between the field isolation patterns 35' and the first conductive patterns 50.

Next, a gate interlayer insulator 60 may be formed on the top surface and sidewalls of the first conductive pattern 50 and a top surface of the exposed field isolation patterns 35'. A second conductive layer 70 may then be formed on the gate interlayer insulator 60. The gate interlayer insulator 60 may be formed, for example, of sequentially stacked silicon oxide, silicon nitride and silicon oxide. The second conductive layer 70 may be formed, for example, of at least one material selected from the group consisting of multi-crystalline silicon, tungsten, cobalt, tungsten silicide, cobalt silicide and/or copper. Then, the gate interlayer insulator 60 and the second conductive layer 70 may be patterned in a direction crossing the active region, thereby forming a gate pattern.

Figure 8:
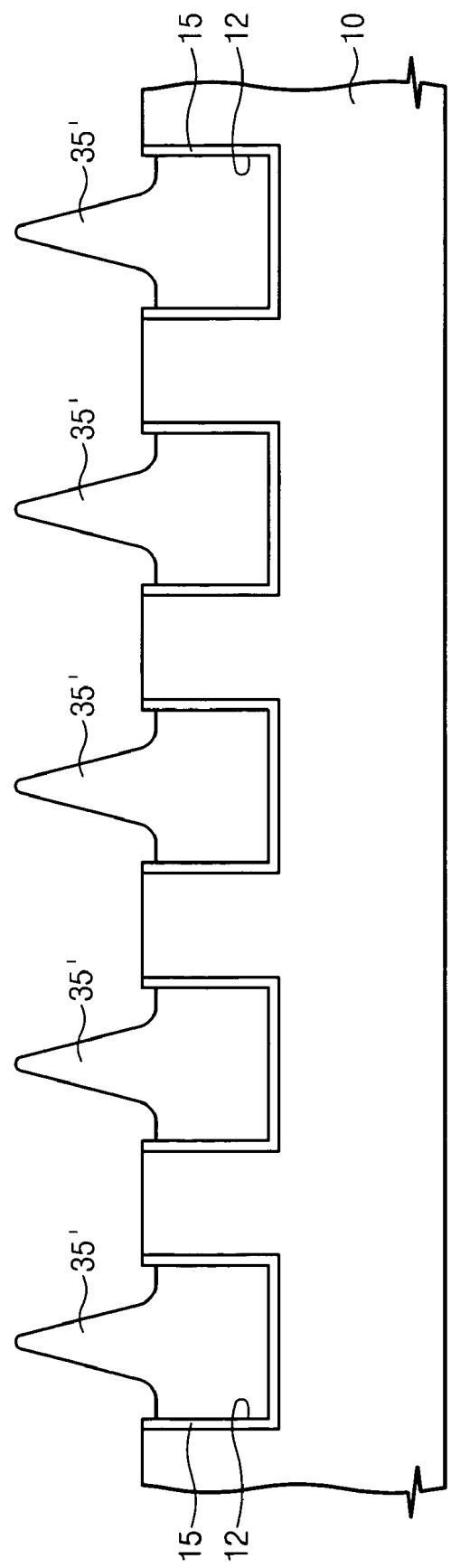
FIG. 8 is a cross-sectional view illustrating how non-densified field isolation patterns may be etched during removal of a pad oxide layer.
Figure 9:
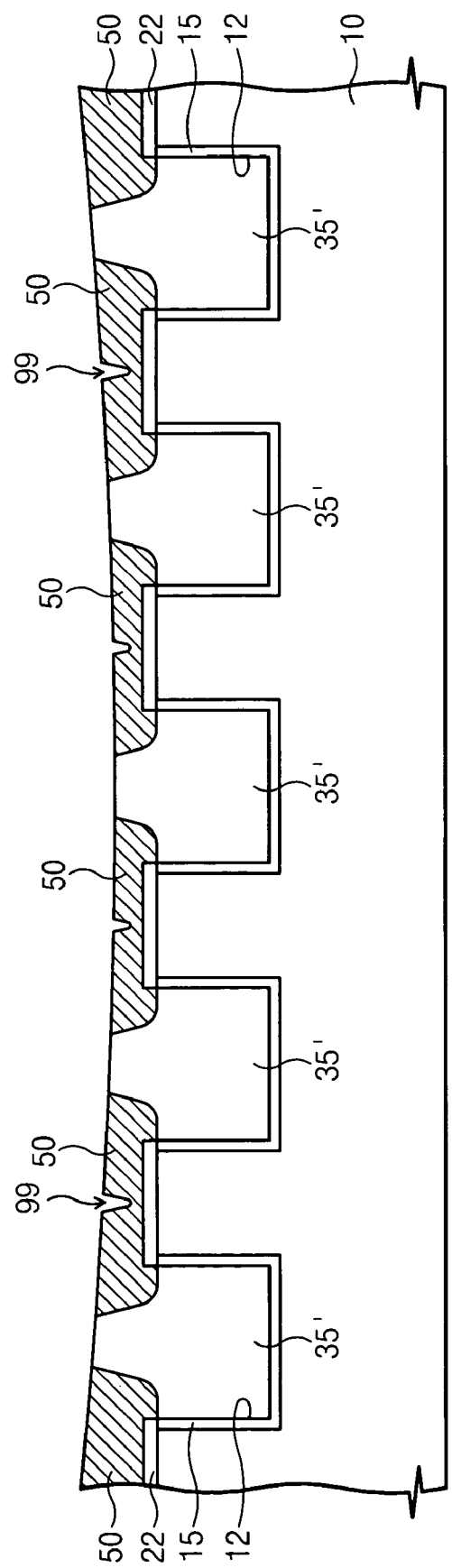
FIG. 9 is a cross-sectional view illustrating seams that may be formed on the top surfaces of the first conductive patterns.

As noted above, if a thermal annealing process or some other process for increasing the resistance of the field oxide pattern to etching during the removal of the pad oxide patterns 22 is not used (i.e. densified), the field isolation patterns 35' may be excessively etched (or recessed) when the pad oxide pattern 22 is removed. This is illustrated in FIG. 8. If this occurs, the field isolation patterns 35' may not be effective for acting as an etch-stop layer during the planarize-etch process that may be used to form the first conductive patterns 50. As a result, as illustrated in FIG. 9, the first conductive patterns 50 may be excessively etched. Moreover, the etching of the first conductive patterns 50 may be less uniform.

Furthermore, a seam or a void, which can cause a failure of a semiconductor device, may be formed in the first conductive pattern (see reference numeral 99 in FIG. 9). When the first conductive layer is formed on a surface that has been planarized-etched, little or no seam or void may be formed. However, according to embodiments of the present invention, the first conductive pattern may be formed on the field isolation patterns 35'. As such, a seam or a void may be formed. The extent of the seam or void may increase with the extent to which the semiconductor device is highly integrated.

Figure 7:
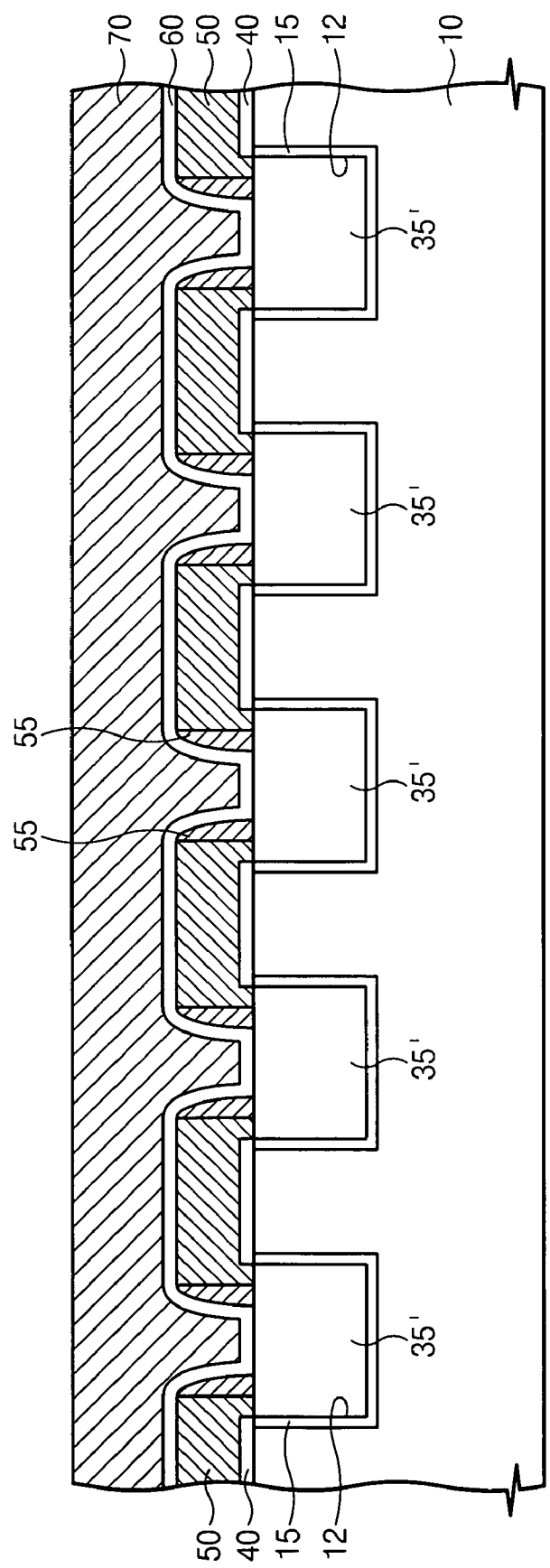
FIG. 7 is a cross-sectional view illustrating methods of forming a semiconductor device according to further embodiments of the present invention.

FIG. 7 is a cross-sectional view illustrating methods according to further embodiments of the present invention which may be used to reduce and/or minimize the formation of such seams and/or voids.

As explained above in the discussion of FIG. 6, the upper portions of the field isolation patterns 35' are etched to form gap regions between the first conductive patterns 50. Referring to FIG. 7, a conductive layer is formed on the resultant structure. The conductive layer may be formed of the same material as the first conductive patterns 50. Thus, the seam or the void that may be formed in the first conductive patterns 50 may be partially or completely filled by the conductive layer.

Next, the conductive layer may be etched to form conductive spacers 55 on sidewalls of the first conductive pattern 50. The combination of two conductive spacers 55 and a first conductive pattern 50 comprises the floating gate electrode. Thus, a facing area between the floating gate electrode and the gate interlayer insulator 60 is increased proportionally to a thickness of the conductive layer, i.e., a width of the conductive spacer 55. As a result, the coupling ratio of the gate interlayer insulator, which may be defined as the fraction of the voltage applied to a control gate electrode that is transferred to the floating gate electrode, may be increased.

Figure 10:
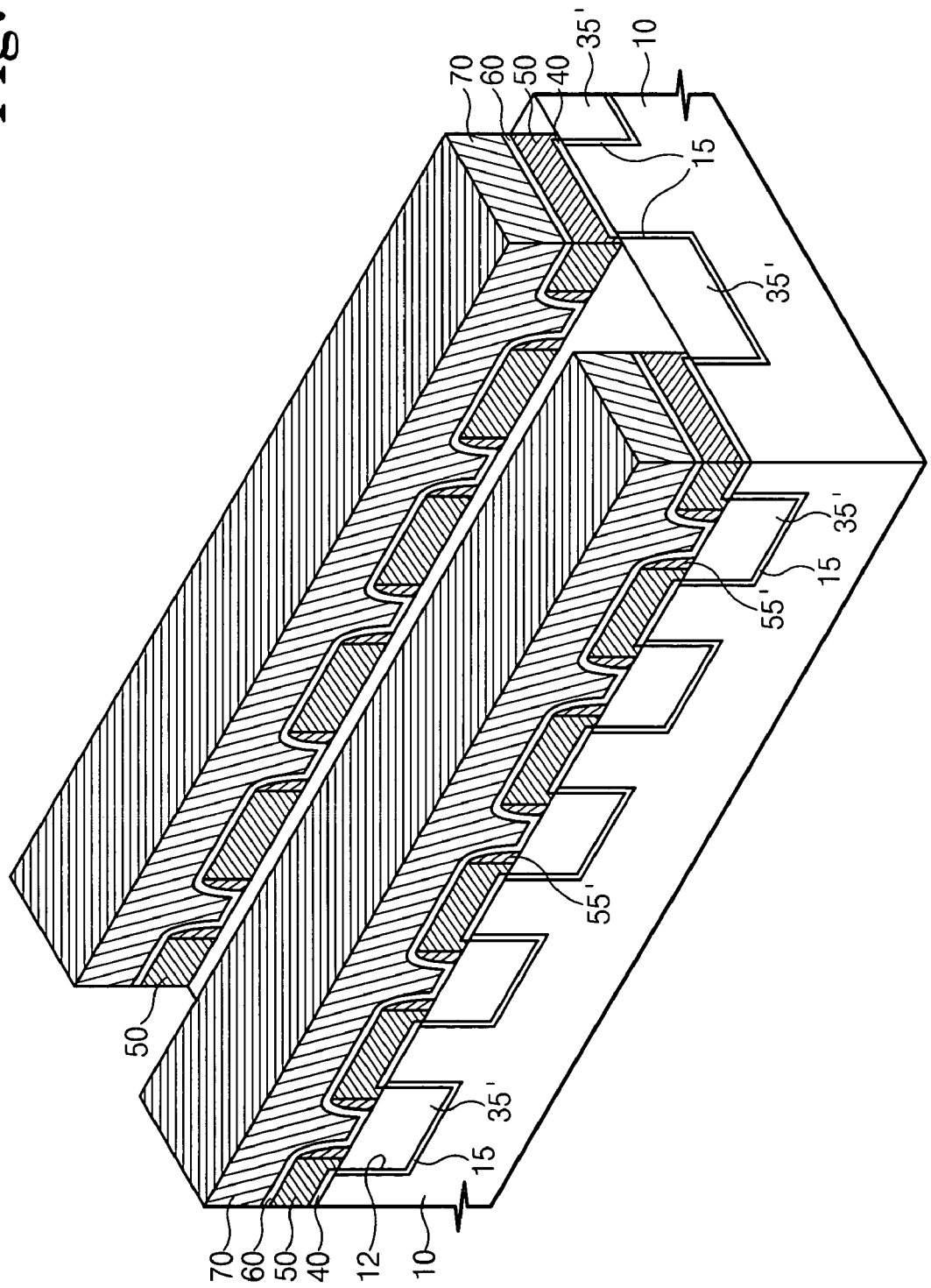
FIG. 10 is a perspective view of a nonvolatile memory device according to embodiments of the present invention.

FIG. 10 is a perspective view of a semiconductor device (in this case a nonvolatile memory device) according to embodiments of the present invention. As shown in FIG. 10, a plurality of field isolation patterns 35' are provided which define active regions in the semiconductor substrate 10. The field isolation patterns 35' may be formed in trenches 12 formed by an STI process, and may be formed of silicon oxide. Additionally, the field isolation patterns 35' may be formed using a multilayered insulation layer such as, for example, stacked HTO and PETEOS layers. A thermal oxide layer 15 may be disposed on the field isolation patterns 35' and on the inner walls of the trenches 12.

A gate insulation pattern 40 is provided on each of the active regions. The gate insulation pattern 40 may be formed, for example, of at least one material selected from the group consisting of silicon oxide, tungsten nitride, titanium nitride, tantalum nitride, silicon nitride and/or silicon oxynitride. A first conductive pattern 50 is on each gate insulation pattern 40 and has a width that exceeds the width of the active region such that the first conductive pattern 50 also overlaps edges of the adjacent field isolation patterns 35'. In certain embodiments of the present invention, the extent to which the first conductive pattern 50 overlaps the adjacent field isolation patterns 35' may be essentially identical.

Conductive spacers 55 are disposed on both sidewalls of each first conductive pattern 50. The combination of these conductive spacers 55 and the first conductive pattern 50 comprise the floating gate electrode. The conductive spacers 55 are on respective field isolation patterns 35'. The first conductive patterns 50 and the conductive spacers 55 may each be formed, for example, of at least one material selected from the group consisting of multi-crystalline silicon, tungsten, cobalt, tungsten silicide, cobalt silicide and/or copper.

A gate interlayer insulator 60 and a second conductive layer 70 are sequentially disposed on the conductive spacers 55 and the first conductive patterns 50. The gate interlayer insulator 60 may be formed, for example, of sequentially stacked silicon oxide, silicon nitride and silicon oxide. The second conductive layer 70 may be formed, for example, of at least one material selected from the group consisting of multi-crystalline silicon, tungsten, cobalt, tungsten silicide, cobalt silicide and/or copper.

According to certain embodiments of the present invention, first conductive patterns may be formed using thermally-annealed field isolation patterns as a mold. Thus, the field isolation patterns are not excessively recessed when the pad oxide patterns are removed, and hence the field isolation patterns may adequately perform as an etch-stop during a planarization-etch process that may be used to form the first conductive patterns. As a result, the vertical height of the first conductive patterns may be controlled and the extent to which the first conductive patterns overlap adjacent field isolation patterns on each side of the active region may be relatively uniform regardless of whether or not an additional photolithography process is used.

Additionally, according to certain embodiments of the present invention, conductive spacers may be formed on the sidewalls of the first conductive pattern as part of a process that may be used to effectively fill a seam or a void that may be present in one or more of the first conductive patterns.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of fabricating a semiconductor device, comprising:

forming a plurality of field isolation patterns on a semiconductor substrate to define a plurality of active regions in the semiconductor substrate;

increasing the density of the field isolation patterns by thermally annealing the field isolation patterns;

forming a plurality of gate insulation patterns on respective of the active regions;

forming a first conductive layer on the gate insulation patterns and on the field isolation patterns; and planarizing the first conductive layer at least to the depth of the top surfaces of the field isolation patterns to form a plurality of first conductive patterns on respective of the gate insulation patterns; and forming first and second conductive spacers on sidewalls of at least some of the first conductive patterns;

planarizing the first conductive layer at least to the depth of the top surfaces of the field isolation patterns to form a plurality of first conductive patterns on respective of the gate insulation patterns;
forming first and second conductive spacers on sidewalls of at least some of the first conductive patterns.

2. A method of fabricating a semiconductor device, comprising:
forming a plurality of field isolation patterns on a semiconductor substrate to define a plurality of active regions in the semiconductor substrate;
increasing the density of the field isolation patterns;
forming a plurality of gate insulation patterns on respective of the active regions; and
forming a plurality of first conductive patterns on respective of the gate insulation patterns;
forming first and second conductive spacers on sidewalls of at least some of the first conductive patterns by:
etching the field isolation patterns after forming the first conductive patterns to form a plurality of gap regions, wherein the gap regions are between adjacent of the first conductive patterns, and then
forming a conductive layer on at least the first conductive patterns and sidewalls of the gap regions, wherein the conductive layer at least partially fills a seam that is present in a top surface of at least one of the first conductive patterns, and
anisotropically etching the conductive layer to expose a top surface of the field isolation patterns.

3. The method of claim 2, further comprising:
forming an insulative layer on the field isolation patterns and the sidewalls and top surfaces of the first conductive patterns; and
forming a second conductive layer on the insulative layer.

4. The method of claim 2, wherein the first conductive patterns and the conductive layer are formed of substantially the same material.

5. The method of claim 1, wherein the first and second conductive spacers are formed of at least one material selected from the group consisting of multi-crystalline silicon, tungsten, cobalt, tungsten silicide, cobalt silicide and/or copper.

6. The method of claim 1, wherein the field isolation patterns are thermally annealed at one or more temperatures in the range from about 500 Celsius to about 900 Celsius for a time ranging from about 5 minutes to about 1 hour.

7. The method of claim 1, wherein forming the field isolation patterns on the semiconductor substrate to define the plurality of active regions in the semiconductor substrate comprises:
forming trench mask patterns on the semiconductor substrate;
forming trenches that define the active regions between the trench mask patterns; and
forming the field isolation patterns in the trenches and spaces between the trench mask patterns.

8. The method of claim 1, wherein the time, temperature and/or length of the thermal annealing process are selected to ensure that the field isolation patterns are not excessively recessed during a subsequent removal of an oxide layer.

9. The method of claim 1, further comprising partially etching the increased density field isolation patterns so that the field isolation patterns each have an upper portion that has a width that is less than a width of a lower portion of each field isolation pattern.

10. A method of fabricating a semiconductor device, comprising:
forming trench mask patterns that include at least pad oxide patterns on a semiconductor substrate;
forming trenches defining active regions at the semiconductor substrate between the trench mask patterns;
forming field isolation patterns in the trenches and spaces between the trench mask patterns;
thermally annealing the field isolation patterns to increase the density of the field isolation patterns;
simultaneously etching the pad oxide patterns and the densified field isolation patterns to remove the pad oxide patterns and to partially etch the densified field isolation patterns; and then
forming a plurality of gate insulation patterns on respective of the plurality of active regions; and
forming a plurality of first conductive patterns on respective of the plurality of gate insulation patterns.

11. The method of claim 10, wherein forming the trench mask patterns comprises:
forming a trench mask layer comprising at least a pad oxide layer and an silicon nitride layer on the semiconductor substrate; and
patterning the trench mask layer to form a respective one of the pad oxide patterns and a silicon nitride pattern on each active region.

12. The method of claim 10, wherein forming the field isolation patterns comprises:
forming a field isolation layer in the trenches; and
planarization-etching the field isolation layer to expose the trench mask patterns.

13. The method of claim 12, wherein the field isolation layer comprises at least one material selected from the group consisting of HTO, PETEOS, MTO, HDP and/or SOG layers.

14. The method of claim 12, further comprising forming a thermal oxide layer on inner walls of the trenches before forming the field isolation layer.

15. The method of claim 11, the method further comprising:
removing the silicon nitride patterns using a selective etch recipe that does not significantly etch the pad oxide patterns or the field isolation patterns; and
wherein the thermal annealing is performed before the pad oxide patterns are removed.

16. The method of claim 10, wherein the field isolation patterns are thermally annealed at one or more temperatures in the range from about 500 Celsius to about 900 Celsius for a time ranging from about 5 minutes to about 1 hour.

17. The method of claim 10, wherein the gate insulation patterns are formed of at least one material selected from the group consisting of silicon oxide, tungsten nitride, titanium nitride, tantalum nitride, silicon nitride and/or silicon oxynitride.

18. The method of claim 10, wherein the first conductive patterns are formed of at least one material selected from the group consisting of multi-crystalline silicon, tungsten, cobalt, tungsten silicide, cobalt silicide and/or copper.

19. A method of fabricating a semiconductor device, comprising:
forming trench mask patterns on a semiconductor substrate;
forming trenches defining active regions at the semiconductor substrate between the trench mask patterns;
forming field isolation patterns in the trenches and spaces between the trench mask patterns;
thermally annealing the field isolation patterns to increase the density of the field isolation patterns;
removing the trench mask patterns;
forming a plurality of gate insulation patterns on respective of the plurality of active regions;

forming a plurality of first conductive patterns on respective of the plurality of gate insulation patterns; and then
etching the field isolation patterns to form a plurality of gap regions, wherein the gap regions are between adjacent of the first conductive patterns;
forming a gate interlayer insulator on the field isolation patterns and the sidewalls and top surfaces of the first conductive patterns; and
forming a second conductive layer on the gate interlayer insulator.

20. The method of claim 19, wherein the gate interlayer insulator is formed of sequentially stacked silicon oxide, silicon nitride and silicon oxide, and the second conductive layer is formed of at least one material selected from the group consisting of multi-crystalline silicon, tungsten, cobalt, tungsten suicide, cobalt silicide and/or copper.

21. The method of claim 19, before forming the gate interlayer insulator, further comprising forming conductive spacers on sidewalls of the first conductive patterns.

22. The method of claim 21, wherein forming the conductive spacers comprises:
forming a conductive layer on at least the first conductive patterns and sidewalls of the gap regions, wherein the conductive layer at least partially fills a seam that is present in a top surface of at least one of the first conductive patterns; and
anisotropically etching the conductive layer to expose a top surface of the field isolation patterns.

23. The method of claim 21, wherein the conductive spacers are formed of at least one material selected from the group consisting of multi-crystalline silicon, tungsten, cobalt, tungsten silicide, cobalt silicide and/or copper.

24. The method of claim 10, wherein the thermal annealing is performed after the trench mask patterns are removed.

25. The method of claim 10, wherein forming the plurality of first conductive patterns comprises:
forming a first conductive layer on the gate insulation patterns and on the field isolation patterns; and
planarizing the first conductive Layer at least to the depth of the top surface of the field isolation patterns to form the plurality of first conductive patterns.

26. The method of claim 25, wherein an upper portion of each field isolation pattern includes a recess on each side, and wherein the first conductive layer is formed on a lower portion of each field isolation pattern to fill the recess on each side of the upper portion of each field isolation pattern.

27. The method of claim 25, wherein the first conductive patterns and the conductive layer are formed of substantially the same material.

28. The method of claim 15, wherein the time, temperature and/or length of the thermal annealing process are selected to ensure that the field isolation patterns are not excessively recessed during a subsequent removal of the pad oxide layers.

29. The method of claim 10, further comprising partially etching the increased density field isolation patterns so that the field isolation patterns each have an upper portion that has a width that is less than a width of a lower portion of each field isolation pattern.

30. A semiconductor device comprising:
a plurality of field isolation patterns defining a plurality of active regions at a semiconductor substrate;
a plurality of gate insulation patterns on respective of the plurality of active regions
a plurality of first conductive patterns that have an upper surface and first and second sidewalls on respective of the plurality of gate insulation patterns and on respective top surfaces of the plurality of field isolation patterns;
a pair of conductive spacers on the first and second sidewalls of each of the first conductive patterns;
a gate interlayer insulator on the upper surface and on the first and second sidewalls of each of the plurality of first conductive patterns;
a second conductive layer on the gate interlayer insulator.

31. The semiconductor device of claim 30, wherein the first conductive patterns are wider than a width of the active region disposed thereunder.

32. The semiconductor device of claim 30, wherein the conductive spacers are formed of at least one material selected from the group consisting of multi-crystalline silicon, tungsten, cobalt, tungsten silicide, cobalt silicide and/or copper.

33. The semiconductor device of claim 31, wherein the first conductive patterns and the conductive spacers are formed of substantially the same material.

34. A method of forming a semiconductor device, comprising:
forming trench mask patterns on a semiconductor substrate;
forming trenches defining active regions at the semiconductor substrate between the trench mask patterns;
forming field isolation patterns in the trenches and spaces between the trench mask patterns;
thermally annealing the field isolation patterns to increase the density of the field isolation patterns;
removing the trench mask patterns;
forming a plurality of gate insulation patterns on respective of the plurality of active regions; and
forming a plurality of first conductive patterns on respective of the plurality of gate insulation patterns,
etching the field isolation patterns to form a plurality of gap regions, wherein the gap regions are between adjacent of the first conductive patterns;
forming conductive spacers on sidewalls of the first conductive patterns;
forming a gate interlayer insulator on the field isolation patterns and the sidewalls and top surfaces of the first conductive patterns; and
forming a second conductive layer on the gate interlayer insulator.

35. The method of claim 34, wherein the field isolation patterns are thermally annealed at one or more temperatures in the range from about 500 Celsius to about 900 Celsius for a time ranging from about 5 minutes to about 1 hour.

36. The method of claim 34, wherein forming the conductive spacers comprises:
forming a conductive layer on at least the first conductive patterns and sidewalls of the gap regions, wherein the conductive layer at least partially fills a seam that is present in a top surface of at least one of the first conductive patterns; and
anisotropically etching the conductive layer to expose a top surface of the field isolation patterns.

37. The method of claim 34, wherein the conductive spacers are formed of at least one material selected from the group consisting of multi-crystalline silicon, tungsten, cobalt, tungsten silicide, cobalt suicide and/or copper.

38. The method of claim 34, wherein the gate interlayer insulator is formed of sequentially stacked silicon oxide, silicon nitride and silicon oxide, and the second conductive layer is formed of at least one material selected from the group consisting of multi-crystalline silicon, tungsten, cobalt, tungsten silicide, cobalt suicide and/or copper.

39. A method of fabricating a non-volatile semiconductor device, comprising:

forming a plurality of field isolation patterns on a semiconductor substrate to define a plurality of active regions therebetween in the semiconductor substrate; increasing the density of the filed isolation patterns;

forming a plurality of gate insulating patterns having an upper surface and side surfaces on respective of the active regions between the respective plurality of field isolation patterns so that upper surfaces of adjacent ones of the plurality of field isolation patterns above facing side walls thereof are exposed;

forming a first conductive layer on the upper surfaces and side surfaces of the gate insulation patterns and on the field isolation patterns;

planarizing the first conductive layer at least to the depth of the top surfaces of the field isolation patterns to form a plurality of floating gate electrodes on respective of the gate insulation patterns and on the exposed upper surfaces of the plurality of field isolation patterns;

forming a gate interlayer insulator layer on the plurality of floating gate electrodes; and forming a control gate electrode on the gate interlayer insulator layer.

40. The method of claim 1, wherein an upper portion of each field isolation pattern includes a recess on each side, and wherein the first conductive layer is formed on a lower portion of each field isolation pattern to fill the recess on each side of the upper portion of each field isolation pattern.

41. The method of claim 1, further comprising partially etching the increased density field isolation patterns so that the field isolation patterns each have an upper portion that has a width that is less than a width of a lower portion of each field isolation pattern.

42. The method of claim 1, wherein an upper portion of each field isolation pattern includes a recess on each side, and wherein the first conductive layer is formed to fill the recess on each side of the upper portion of each field isolation pattern.

* * * * *

UNITED STATES PATENT AND TRADEMARK OFFICE
CERTIFICATE OF CORRECTION

PATENT NO. : 7,132,331 B2 Page 1 of 1
APPLICATION NO. : 10/990903
DATED : November 7, 2006
INVENTOR(S) : Jang et al.

It is certified that error appears in the above-identified patent and that said Letters Patent is hereby corrected as shown below:

Column 10,
Line 59 should read -- patterns and on the field isolation patterns; --

Line 65 should read -- of at least some of the first conductive patterns. --

Lines 66-67 should be deleted.

Column 11,
Lines 1-4 should be deleted.

Column 13,
Line 16 should read -- cobalt, tungsten silicide, cobalt silicide and/or copper. --

Line 39 should read -- planarizing the first conductive layer at least to the depth --

Column 14,
Line 63 should read -- cobalt, tungsten silicide, cobalt silicide and/or copper. --

Column 15,
Line 2 should read -- cobalt, tungsten silicide, cobalt silicide and/or copper. --

Line 8 should read -- increasing the density of the field isolation patterns; --

Signed and Sealed this

Twentieth Day of March, 2007

JON W. DUDAS
*Director of the United States Patent and Trademark Office*